United States Patent

Furuta et al.

[11] Patent Number: 5,933,619
[45] Date of Patent: Aug. 3, 1999

[54] LOGIC CIRCUIT DESIGN APPARATUS

[75] Inventors: Eiji Furuta; Hisataka Fukase, both of Yokohama, Japan

[73] Assignee: Fujitsu Limited, Kawasaki, Japan

[21] Appl. No.: 08/604,617

[22] Filed: Feb. 21, 1996

[30] Foreign Application Priority Data

Apr. 7, 1995 [JP] Japan .................................... 7-082253

[51] Int. Cl.⁶ .................................................. G06F 17/00
[52] U.S. Cl. .......................... 395/500; 364/578; 371/22.1
[58] Field of Search .................................. 371/22.3, 21.1, 371/22.1; 364/578, 488, 489, 490, 491; 395/500

[56] References Cited

U.S. PATENT DOCUMENTS 5,067,091 11/1991 Nakazawa ............................... 364/490
5,550,749 8/1996 Dey ......................................... 364/489

*Primary Examiner*—Kevin J. Teska
*Assistant Examiner*—A. S. Roberts
*Attorney, Agent, or Firm*—Staas & Halsey

[57] ABSTRACT

A logic circuit design apparatus capable of designing scan circuits for uses peculiar to the logic circuit and scan circuits for test pattern generation simplification with ease is disclosed. The logic circuit design apparatus comprises a storage part, an acquisition part, a user resister design part, and a data chain design part. The storage part stores a circuit data of a logic circuit whose logic design for normal operation. The acquisition part acquires a design data which specifies a user resister that is a scan circuit to be designed on the logical circuit whose circuit data is stored in the storage part. The user resister design part designs a user resister corresponding the design data acquired by the acquisition part. The data chain design part designs a data chain which is a scan circuit for test pattern generation simplification by utilizing the user register designed by the user register design part.

13 Claims, 11 Drawing Sheets

FIG. 10

```
   ⋮
 FNCAT(···) = ······     } ATTRIBUTE ALLOCATION STATEMENT
   ⋮

UR1 (A) ;
 UR2 (B) ;
 UR3 (C, D) ;            } USER REGISTER
 UR4 (E) ;                   SPECIFICATION STATEMENT
 UR5 (F, G) ;

DT1=UR1 ;
 DT2=NON_UR, UR2 ;       } DATA CHAIN
 DT3=UR3 ;                   SPECIFICATION STATEMENT
 DT4=UR4, UR5 ;
```

LOGIC CIRCUIT DESIGN APPARATUS

BACKGROUND OF THE INVENTION

The present invention relates generally to a logic circuit design apparatus for performing a scan design to a logic circuit whose logic design for normal operation is completed and more particularly, to a logic circuit design apparatus for designing scan circuits for uses peculiar to the logic circuit.

With the advancement of the semiconductor manufacturing process technology in recent years, a logical scale of a logic circuit which can be achieved by one chip has increased. Increasing the logical scale presents greater difficulty in generating a test pattern to test the logic circuit.

A scan design is a technique developed in order to generate the test pattern simply. In the scan design, the memory elements will be connected in such a manner that, on the command of "Test Mode", they will be strung together to form a shift register. That is, by performing the scan design, the logic circuit comes to be able to treated as a combinatorial circuit, so the generation of the test pattern becomes easy.

Moreover, the value maintained in a specific memory element can be read and a specific value can be set in the specific memory element by using the scan circuit. Therefore, the scan circuit can be also used for the maintenance and the like.

The conventional CAD system which has been used for the scan design so far, however, generates the scan circuit for the test pattern generation simplification. Accordingly, the scan circuit is not a suitable one for other uses, such as maintenance. Complex manual work of modifying the logic circuit, on which scan circuits are designed, is necessary to get the scan circuit for a use peculiar to the logic circuit.

SUMMARY OF THE INVENTION

It is a primary object of the present invention to provide a logic circuit design apparatus capable of designing scan circuits for uses peculiar to the logic circuit and scan circuits for test pattern generation simplification with ease.

A logic circuit design apparatus according to the present invention comprises a storage part, an acquisition part, a user register design part, and a data chain design part. The storage part stores a circuit data of a logic circuit whose logic design for normal operation. The acquisition part acquires a design data which specifies a user register that is a scan circuit to be designed on the logical circuit whose circuit data is stored in the storage part. The user register design part designs a user register corresponding the design data acquired by the acquisition part. The data chain design part designs a data chain which is a scan circuit for test pattern generation simplification by utilizing the user register designed by the user register design part.

That is, the logic circuit design apparatus according to the present invention designs the user register which is a scan circuit for a use peculiar to the logic circuit at first, and designs the data chain, which is a scan circuit for test pattern generation simplification, utilizing the user chains.

Further, the data which contains an attribute allocation data that allocates an attribute name to a memory element in the logic circuit and a user register specification data containing at least one attribute name may be used as the design data. In this case, the user register design part is constructed to design a user register from the memory elements to which the attribute name, which is contained in the user register specification data, is allocated by the attribute allocation data.

In the case of taking this construction, the designer can change the user register to be generated on the logic circuit by modifying the attribute allocation data or the user register specification data. Accordingly, the designer can specify the user register to be designed on the logic circuit with ease.

Furthermore, the data which associates a logic block and an attribute name can be used as the attribute allocation data. In this case, the user register design part is constructed to recognize, if an attribute allocation data concerns a logical block containing a plural of memory elements is in the design data, that the attribute name in the attribute allocation data is allocated to all the memory elements in the logic block.

In the case of taking this construction, the attribute name can be allocated to plural memory elements with one attribute allocation data, and it is therefore possible for the designer to specify the user registers composed of a large number of memory elements easily.

Moreover, when the data which associates a logic block and an attribute name is used as the attribute allocation data, it is preferable to use the user register design part which recognizes, if the 1st attribute specification statement concerning the logic block X and the 2nd attribute allocation data concerning the logic block Y which includes the logic block Y exist in the design data file, that the attribute name described in the 1st attribute allocation data is allocated to the flipflops in the logic block X.

In the case of taking this construction, the designer can specify the user registers composed of a large number of memory elements more easily.

Further, the logic circuit design apparatus may be constructed with the attribute allocation data which contains a connection order data, and the user register design part which designs the user register by stringing the memory elements in the order corresponding the connection order data.

Moreover, the logic circuit design apparatus may be constructed with the attribute allocation data which contains an opposite polarity use instruction data for instructing whether or not an opposite polarity terminal should be used, and the user register design part which designs the user-register by adding an inverter circuit to an opposite polarity output terminal of a memory element with an opposite polarity use instruction data implying that the opposite polarity terminal should be used and connecting the output of the inverter circuit with the following memory element.

Furthermore, the data chain design part which designs plural data chains composed of the memory elements of almost the same number and another data chain by stringing the data chains can be used.

Moreover, it is preferable to add the logic circuit diagram creating part, which creates a logic circuit diagram of the logic circuit designed by the user register design part and the data chain design part, to the logic circuit design apparatus.

Note that the logic circuit diagram creating part is, if provided, desirably constructed to create, in case a interconnection crosses a boundary of a logic block, a logical circuit diagram having an interface terminal symbol for the interconnection on the boundary.

Also, the logic circuit diagram creating part may be constructed to creates, in case two or more interconnections crosses a boundary of a logic block, a logic circuit diagram in which the interconnections are represented by a bundle line.

Further, the logic circuit diagram creating part may be constructed so as to create, in case a user register containing a set of memory elements to be expressed with a stack notation exists, a logic circuit diagram in which their memory elements are represented with two blocks one of which stands for one memory element positioned at one end in the set of the memory elements, and the other of which stands for the remaining memory elements in the set of the memory elements.

Moreover, the logic simulation part which tests the logic circuit designed by the user register design part and the data chain design part can be added to the logic circuit design apparatus.

BRIEF DESCRIPTION OF THE DRAWINGS

Other objects and advantages of the present invention will become apparent during the following discussion in conjunction with the accompanying drawings, in which:

FIG. 10 is a explanatory chart showing contents of a design data file which is used in the logic circuit design process;

DESCRIPTION OF THE PREFERRED EMBODIMENTS

A logic circuit design apparatus according to the present invention will be discussed in detail with reference to the accompanying drawings.

Figure 1:
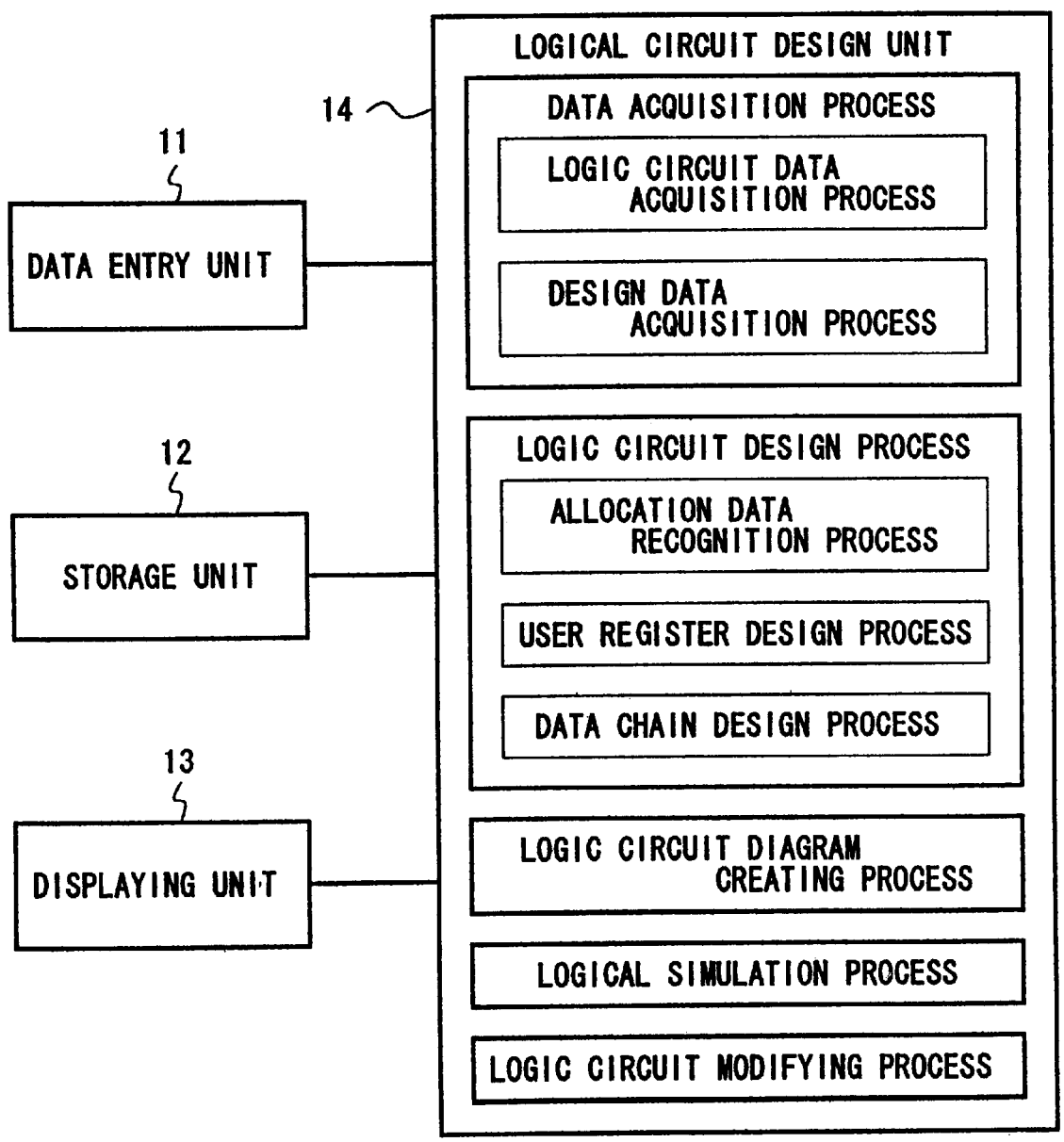
FIG. 1 is a block diagram illustrating a construction of a logic circuit design apparatus in a embodiment of the present invention.

FIG. 1 illustrates a logic circuit design apparatus in an preferred embodiment of the present invention. As depicted therein, the logic circuit design apparatus in accordance with this embodiment includes a data entry unit 11, a storage unit 12, a displaying unit 13, and a logic circuit design unit 14.

The logical circuit design apparatus is realized by a computer system in which a fixed program runs. The data entry unit 11 corresponds to a keyboard and a mouse in the computer system. The storage unit 12 and the displaying unit 13 correspond to a secondary storage and a graphic display respectively. The logic circuit design unit 14 corresponds to a CPU and its circumference circuits.

The logical circuit design part 14 is, as depicted in FIG. 1, constructed as to be capable of executing a data acquisition process, a logic circuit design process, a logic circuit diagram creating process, a logical simulation process, and a logic circuit modifying process.

Hereinafter, operating procedures of logic circuit design unit 14 in each process will be explained.

<Data Acquisition Process>

The logic circuit design apparatus is an apparatus to provide support for designing scan circuits on a logic circuit, the design for normal operations of which is completed. Thus, the apparatus needs interconnection data concerning a logic circuit and design data which specify scan circuits to be generated on the logic circuit.

The data acquisition process is executed for the acquisition of these data. The data acquisition process consists of includes a logic circuit data acquisition process and a design data acquisition process.

When an instruction to execute the logic circuit data acquisition process is inputted by a designer (user of this apparatus), the logic circuit design part 14 operates obeying the instruction and acquires a logic circuit data. For instance, if logic circuit data is ordered to be acquired from a CAD system connected with this logic circuit design apparatus, the logic circuit design unit 14 executes a process for establishing a connection to the CAD system and a process for receiving the logic circuit data through the connection, preparing the logic circuit data in the storage unit 12.

The design data acquisition process is executed after the logic circuit data acquisition process. In this process, the design data file containing attribute allocation statements, user register specification statements, and data chain specification statements is created corresponding to the data inputted by the designer.

<Logic Circuit Design Process>

The logic circuit design process is executed after the completion of the design data acquisition process. The process is composed of an allocation data recognition process, a user register design process, and a data chain design process as depicted in FIG. 1. Among these processes, the allocation data recognition process is executed at first. In the allocation data recognition process, attribute allocation statements included in the design data file are interpreted.

The attribute allocation statement in the design data file has a form "FNCAT(a memory element identifier)=an attribute name/a connection order data/an opposite porality use instruction data". "FNCAT" is a reserved word for the attribute allocation statements. The logic circuit design unit 14 treats a statement start by "FNCAT" as an attribute allocation statement and recognizes data described after "=" are allocated to a memory element identified by the memory element identifier. Note that the connection order data and the opposite polarity use instruction data are optional.

For the memory element identifier, a logic block identifier or a flipflop identifier is described. If a flipflop identifier is described as the memory element identifier, the logic circuit design unit 14 recognizes that the data after "=" are allocated to one flipflop identified by the flipflop identifier. If a logic block identifier is described as the memory element identifier, it recognizes that the data are allocated to each flipflop in a logic block identified by the logic block identifier.

In case two or more attribute specification statements concerning same flipflops exist in the design data file, the logical circuit design unit 14 recognizes that the attribute name described in the attribute allocation statement which has a memory element identifier of the lower level hierarchy is allocated to their flipflops.

Figure 2:
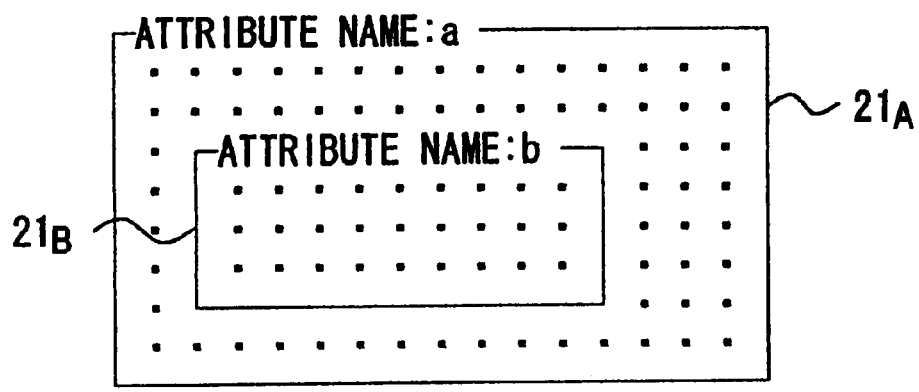
FIG. 2 is a schematic diagram for explaining the data acquisition process in the logic circuit design apparatus.

That is, as schematically shown in FIG. 2, if an attribute name "a" is allocated to a logical block $21_A$ and an attribute name "b" is allocated to a logical block $21_B$ which is included in the logical block 21A, the logic circuit design unit 14 recognized that the attribute name "b" is allocated to all flipflops in logic block $21_B$. And, it recognizes that the attribute name "a" is allocated to other flipflops in the logic block $21_A$.

Figure 3:
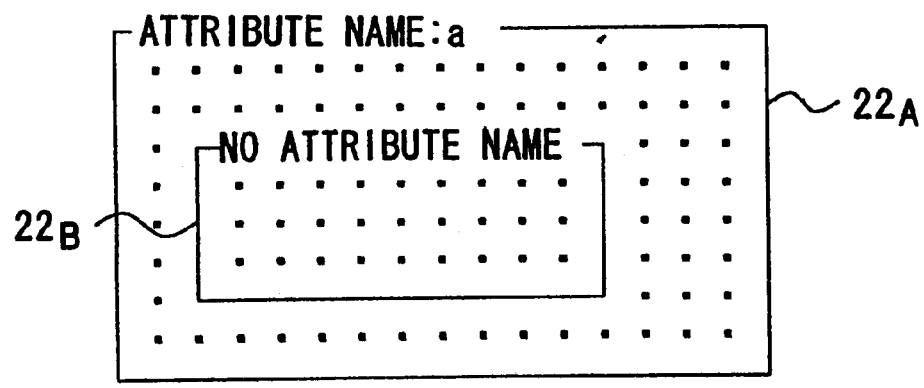
FIG. 3 is a schematic diagram for explaining the data acquisition process in the logic design apparatus.

Note that, as schematically shown in FIG. 3, if an attribute name "a" is allocated to a logic block $22_A$ and no attribute name is allocated to a logic block $22_B$ (which is included in the logic block 22A), the logic circuit design unit 14 recognizes that the attribute name "a" is allocated to every flipflops in the logic block 22A. That is, the unit recognizes that the attribute name "a" is also allocated to every flipflop in the logic block $22_B$ to which no attribute name is allocated.

After the allocation data recognition process, the user register design process and the data chain design process are executed. At first, the outline of these processes will be explained.

In the user register design process, the logical circuit design unit 14 interprets the user register specification statements in the design data file and designs user registers. The user-register statement has a form "URx(an attribute name)". The logic circuit design unit 14 treats a statement which starts by "UR" as the user register statement, and generates (designs) a user register named "URx" from the flipflops with the attribute name described in the ( ).

Figure 4:
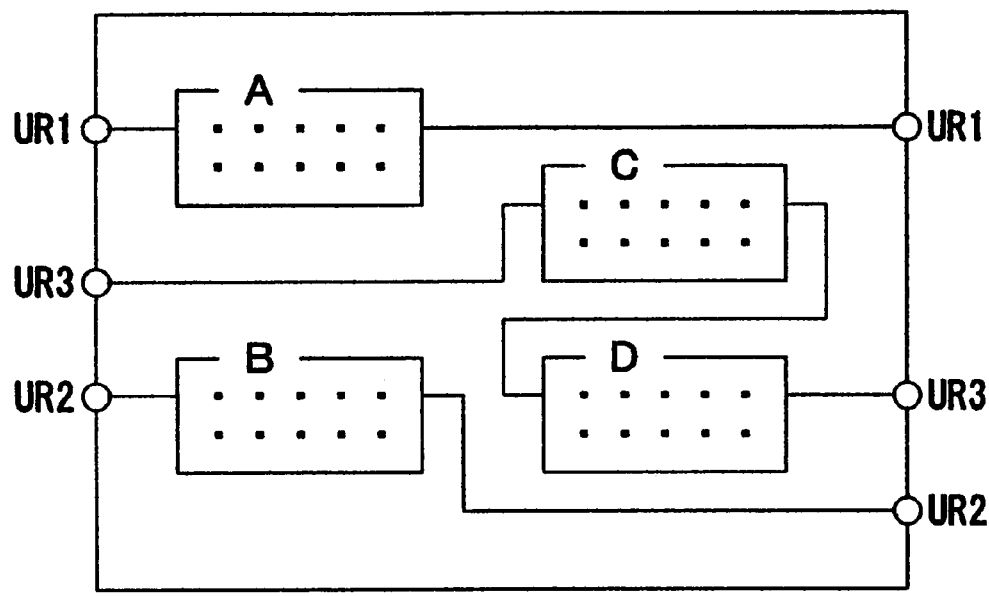
FIG. 4 is a schematic diagram for explaining the user register design process in the logic design apparatus.

For instance, if the user-register specification statements "UR1(A)", "UR2(B)" and "UR3(C,D)" exists in the design data file, the logic circuit design unit 14 generates, as schematically shown in FIG. 4, the user register "UR1" which consists of flipflops with the attribute name "A", and the user register "UR2" which consists of flipflops with the attribute name "B", and the user register "UR3" which consists of flipflops with the attribute name "C" or "D".

When designing the user register, the logic circuit design unit 14 exchanges flipflops, which are specified to be used for generating the user register, for scan flipflops at first. Next, the unit decides a connection order between those scan flipflops and generates a shift register by stringing them. Finally, the unit interconnects the shift register with a data input terminal and a data output terminal, generating the user register.

Figure 5:
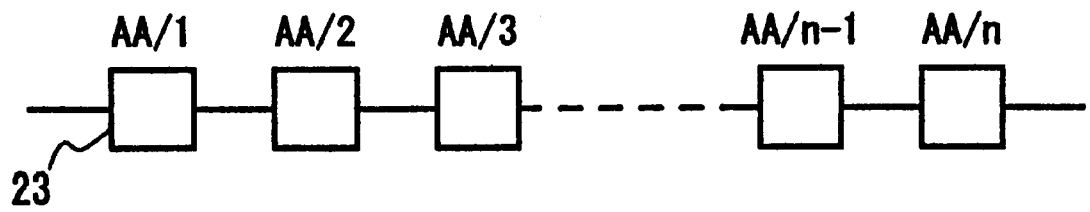
FIG. 5 is a schematic diagram for explaining the connection order data which is a element of the design data file.

In case of generating a shift register, if the connection order data is given to each flipflop, the circuit design unit 14 strings the scan flipflops 23 obeying the connection order data as depicted in FIG. 5. If the connection order data is not given, the unit decides, referring the layout data of the logic circuit, connection order between scan flipflops so that a total interconnection length may shorten.

Figure 6:
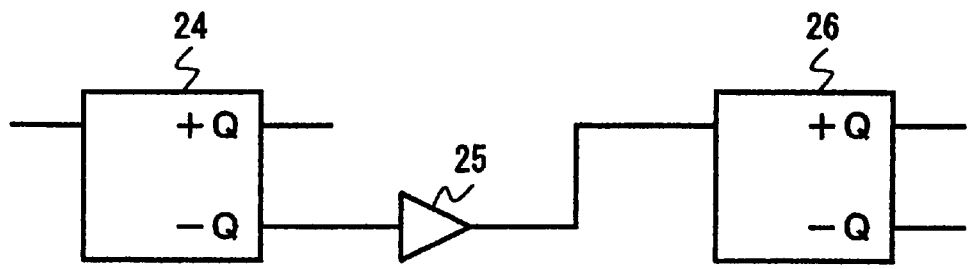
FIG. 6 is a circuit diagram showing a design result when opposite porality use instruction data exists in a attribute allocation statement.

Moreover, when opposite polarity use instruction data is given to a flipflop, the logic circuit design unit 14 interconnects the flipflop with the following flipflop via an inverter circuit. That is, as depicted in FIG. 6, the logic circuit design unit 14 adds the inverter circuit 25 and interconnects the "-Q" output terminal of the scan flipflop 24, to which opposite polarity use instruction data is given, with the input terminal of the inverter circuit 25, and the output terminal of the inverter circuit 25 with the following scan flipflop 26.

Note that, though constructed to use the "-Q" output terminal when the opposite polarity use instruction data is given, the logic circuit design apparatus may be constructed so as to select the output terminal to use for generating a scan circuit automatically according to the number of fan-outs.

Figure 7:
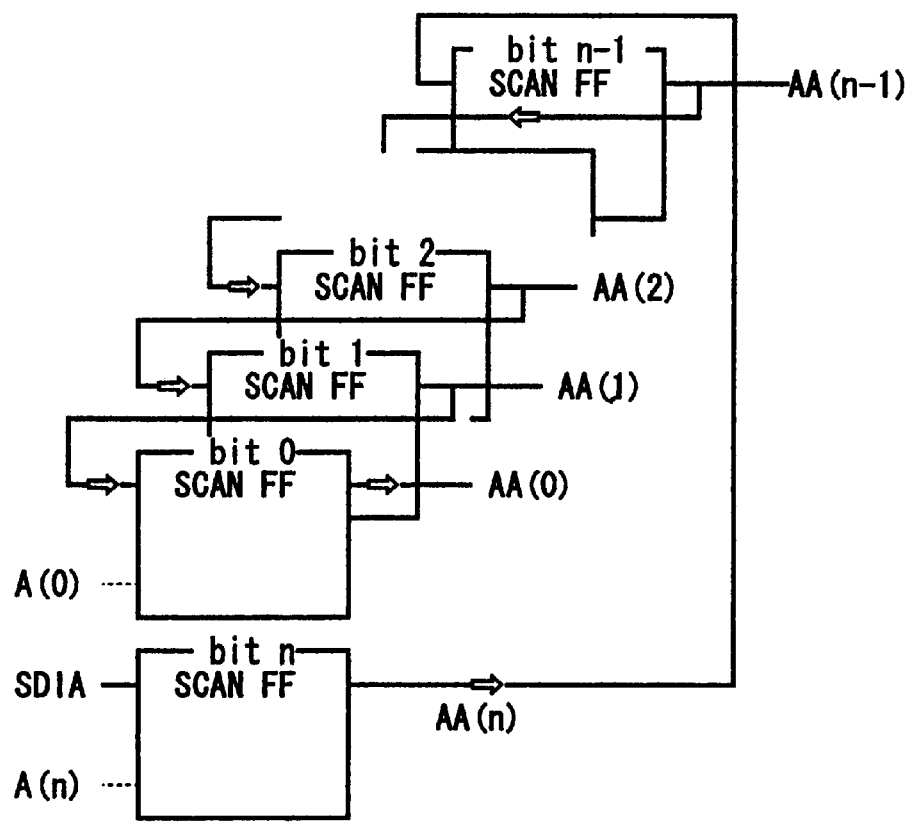
FIG. 7 is a circuit diagram showing the usual connection order between the flipflops to be expressed in a stack notation.

Further, if flipflops to be expressed in a stack notation are included in the user register to design, the logic circuit design unit 14 interconnects their flipflops so that the scan data enters the flipflop for bit n and is outputted from the flipflop for bit 0 as shown in FIG. 7. Note that, if an instruction to shorten the interconnection length is given in the design data file, the logical circuit design unit 14 designs the user register ignoring the stack order of their flipflops.

In addition, when the designer describes the same attribute name in two or more user register specification statements, the logic circuit design unit 14 designs two or more user registers in each of which the same flipflops are included. The design is performed as follows.

For instance, if the user register specification statements "UR1(A,B,C)", "UR2(B,C)" and "UR3(C)" are given, the logic circuit design unit 14 designs chain elements by stringing the flipflops with the attribute name "A", "B", "C", respectively. Next, the unit designs the user register "UR1", to which most attribute names are given, combining the chain elements and computes its interconnection length.

At the same time, the logic circuit design unit 14 designs the user register "UR1" by a usual design procedure and computes its interconnection length. That is, the unit designs the user resister "UR1" by stringing the flipflops to which the attribute name "A" or "B" or "C" is allocated, and computes its interconnection length.

Then, the unit decides the method to use for designing the remaining user registers by comparing the sizes of the computed interconnection lengths. If the former interconnection length is remarkably longer than the latter interconnection length, the logic circuit design unit 14 decides to design the remaining user registers "UR2" and "UR3" by dividing the user register "UR1" generated by a usual design procedure. On the other hand, if the former interconnection length is comparable to the latter interconnection length, the logic circuit design unit 14 decides to design the remaining user registers by utilizing chain elements.

Figure 8:
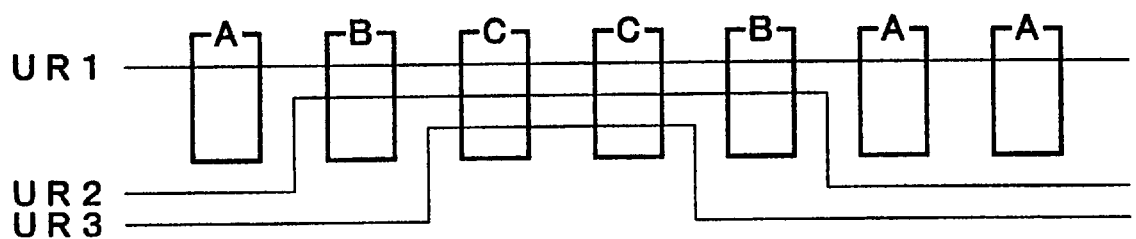
FIG. 8 is a schematic diagram showing a design result when the same attribute name is used in plural user register specification statement.

That is, in case each set of the flipflops with each attribute name is located to one place, the logic circuit design unit 14 design the remaining user registers by utilizing the chain element. On the contrary, in case each set of the flipflops with each attribute name is not located to one place, the logic circuit design unit 14 designs the remaining user registers by dividing the user register generated by a usual design procedures. For instance, if the above-mentioned user register statements relate to a logic circuit in which each set of the flipflops with each attribute name is not located to one place, the logic circuit design unit 14 designs the user registers by interconnecting the flipflops as schematically shown in FIG. 8.

Next, the outline of the data chain design process will be explained.

In the data chain design process, the logical circuit design unit 14 interprets the data chain specification statements in the design data file and designs data chains. The data chain specification statement starts by "DT" and includes a data chain name and at least a user register name. The logic circuit design unit 14 treats the statement which starts by "DT" as the user register statement, and generates the data chain utilizing the user registers specified in the data chain specification statement.

If the data chain specification statement which contains the reserved word "NON_UR" exists in the design data file, the logic circuit design unit 14 generates the data chain using the flipflops with no attribute name. If the data chain specification statement which contains "NON_UR" does not exist in the design data file, the logic circuit design unit 14 uses the flipflops with no attribute name to average the number of the flipflops in each data chain.

Moreover, the logic circuit design unit 14 designs another data chain by unifying the data chains generated corresponding to the data chain specification statements. The generation procedure of this unified data chain will be explained later.

Note that, when the design data file with no data chain statement is given, the logic circuit design unit 14 designs the data chains of the pre-determined number using the flipflops with no attribute name to average the number of the flipflops in each data chain. Further, if the number of scan flipflops included in a certain user register is remarkably bigger than the number of scan flipflops for one data chain, the logic circuit design unit 14 adds a switch circuit to divide the user register and generates data chains by using the divided user registers.

Figure 9:
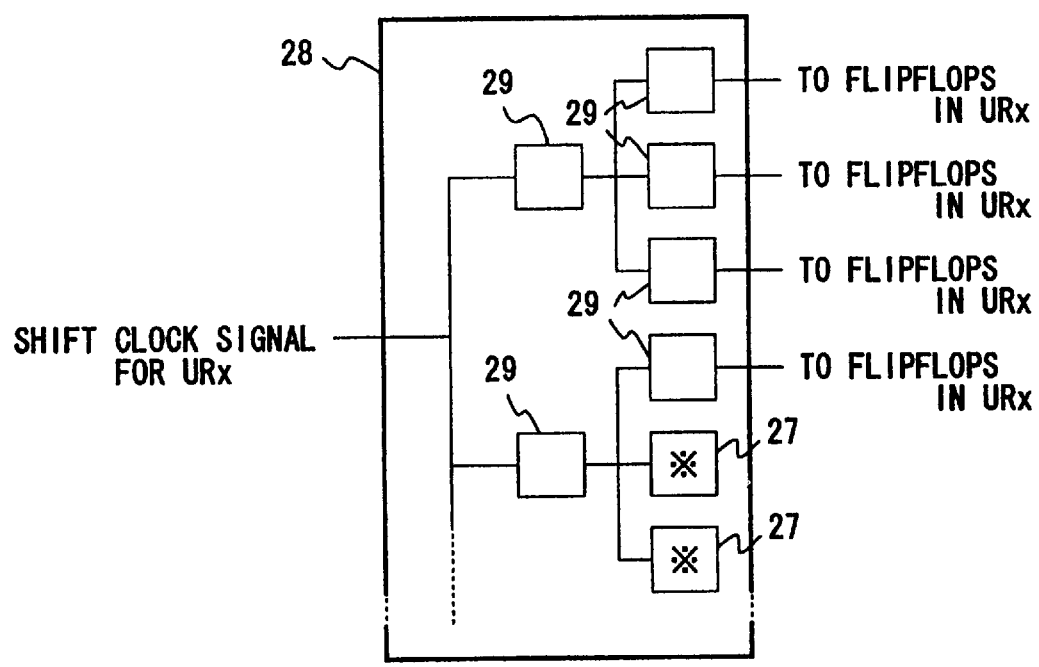
FIG. 9 is a schematic diagram for explaining how the shift clock distribution logic block is modified in installing.

When a scan circuit is designed, the circuit which distributes the shift clock to every scan flipflops in the scan circuit is installed. In the logic circuit apparatus, a shift clock distribution circuit logic block, which has enough number of shift clock amplification gates to any scan circuit, is prepared in a library memorized in storage unit 12. The logic circuit design unit 14 removes, as schematically shown in FIG. 9, needless shift clock amplification gates 27 from the shift clock distribution circuit logic block 28 and creates a logic block including necessary gates 29. Then, the unit designs the scan circuit using the created logic gate.

Figure 11:
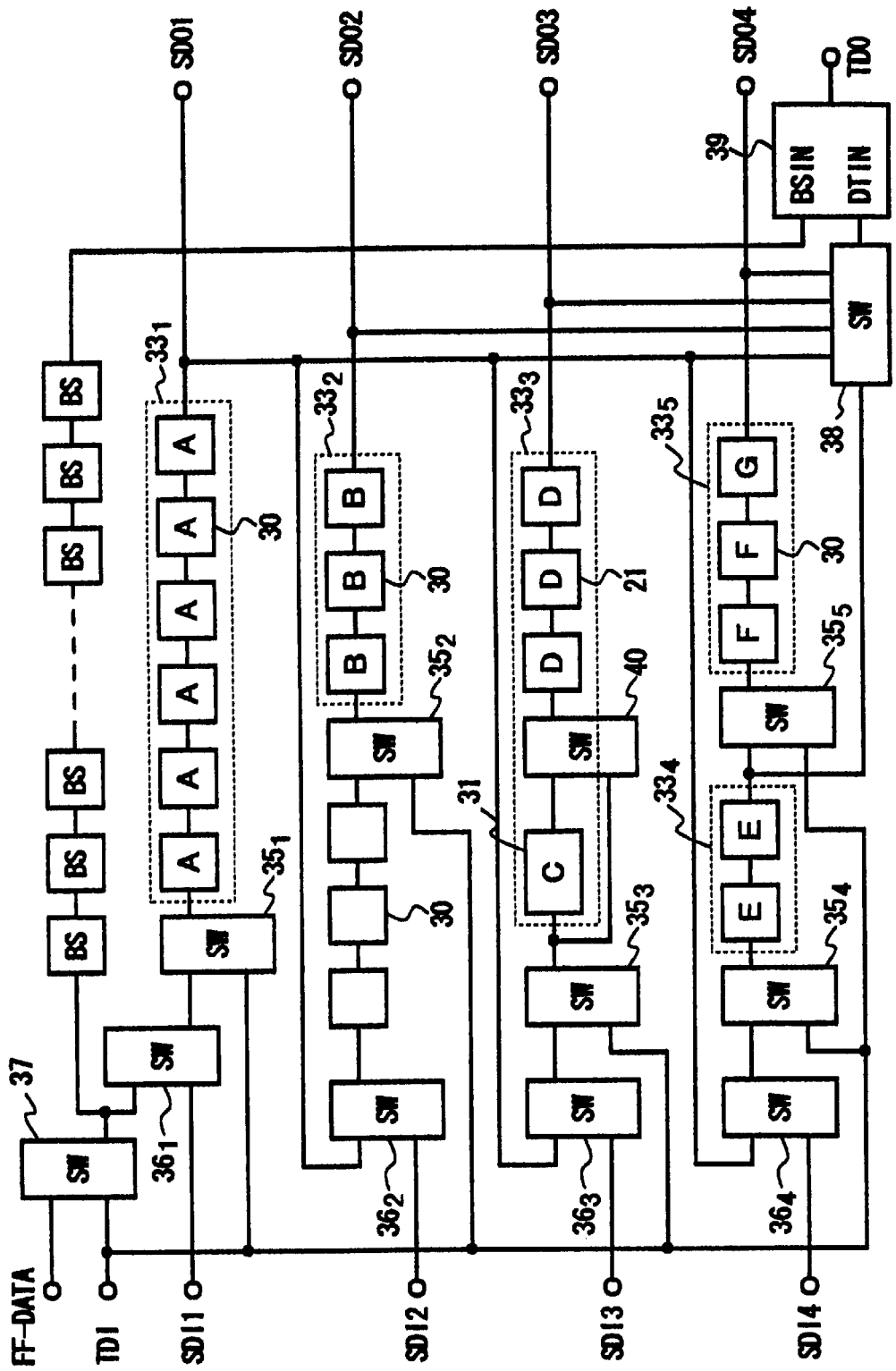
FIG. 11 is a circuit diagram showing a logic circuit designed corresponding to the design data file in FIG. 10.

Hereinafter, referring these FIGS. 10 and 11, the user register design process and the data-chain design process will be explained in greater detail. Note that FIG. 10 shows a design data file and FIG. 11 shows the design results corresponding the design data file. The scan flipflop 30 or the RAM 31 labeled "X" ("X"="A"–"E") in FIG. 11 represents the scan flipflop or the RAM to which the attribute name "X" is allocated. The scan flipflops 30 with no label represent the scan flipflops to which no attribute name is allocated. As described above, the attribute names are allocated to the elements with the attribute allocation statements, however, the detailed description of them are omitted in the design data file in FIG. 10.

In the design data file shown in FIG. 10, five user register specification statements exists, therefore, when the design data file is given, the logic circuit design unit 14 starts to generate five user registers.

As cited above, when generating a user register, the design unit 14 strings scan flipflops and interconnects the stringed flipflops with the data input terminal and the data output terminal. That is, the logic circuit design unit 14 designs an interconnection between a data input terminal "TDI" and the first scan flipflop (the scan flipflop on the edge of the input side of the stringed scan flipflops) and another interconnection between a data output terminal "TDO" and the final scan flipflop (the scan flipflop on the edge of the output side of the stringed scan flipflops).

When designing the former interconnection, the logic circuit design unit 14 adds a switch circuit which enables the user register to function as a part of the data chain. The switch circuits $35_1$–$35_5$ in FIG. 11 are the switch circuits added for the purpose.

When designing the latter interconnection, the logic circuit design unit 14 adds a switch circuit 38 and test system control circuit 39 to the logic circuit and interconnects between switch circuit 38 and the final scan flipflop of each user register 33. The switch circuit 38 is a circuit to supply the data from each user register 33 to the test system control circuit 39.

Further, the logic circuit design unit 14 also adds a decoder circuit (not shown in Figure) which controls the switch circuits. The decoder circuit controls the switch circuits integrally according to the inputted instruction signals. For instance, when the user register $33_5$ is used as a user-register, the decode circuit controls the switch circuit $35_5$ so that the data input terminal "TDI" and user register $33_5$ are connected electrically. Moreover, it controls the switch circuit 38 so that the data input terminal "TDO" and user register $33_5$ are connected electrically.

After the design like this corresponding to each user register specification statement, the logic circuit design part 14 designs the data chains by interconnecting each switch circuit 35 with the user resister or the data input terminal "SDIn" corresponding to each the data chain specification statement. Moreover, the unit adds switch circuits 36 to unifying the data chains.

For example, in the data chain specification for data chain "DT4", the user register names "UR4" and "UR5" are described, therefore, the logic circuit design unit 14 interconnects the switch circuit $35_5$ with the final scan flipflop in the user register $33_4$, and the switch circuit $35_4$ with the data input terminal "SDI4". Moreover, when interconnecting the switch circuit $35_4$ with the data input terminal "SDI4", the unit inserts the switch circuit $36_4$ so that the output of the user register "UR3" can be inputted to the user register "SD4".

These switch circuits are also controlled by the decode circuit. For example, when the data chain "DT4" is activated, the switch circuit $36_4$ is controlled so as to supply the data from the data input terminal "SDI4" to the switch circuit $35_4$, and the switch circuit $35_4$ is controlled so as to supply the output of the switch circuit $36_4$ to the user register $33_4$. Moreover, the switch circuit $35_5$ is controlled to supply the output of the user register $33_4$ to the user resister $33_5$, and the switch circuit 38 is controlled so as to supply the output of the user register $33_5$ to the test system control circuit 39.

Figure 12:
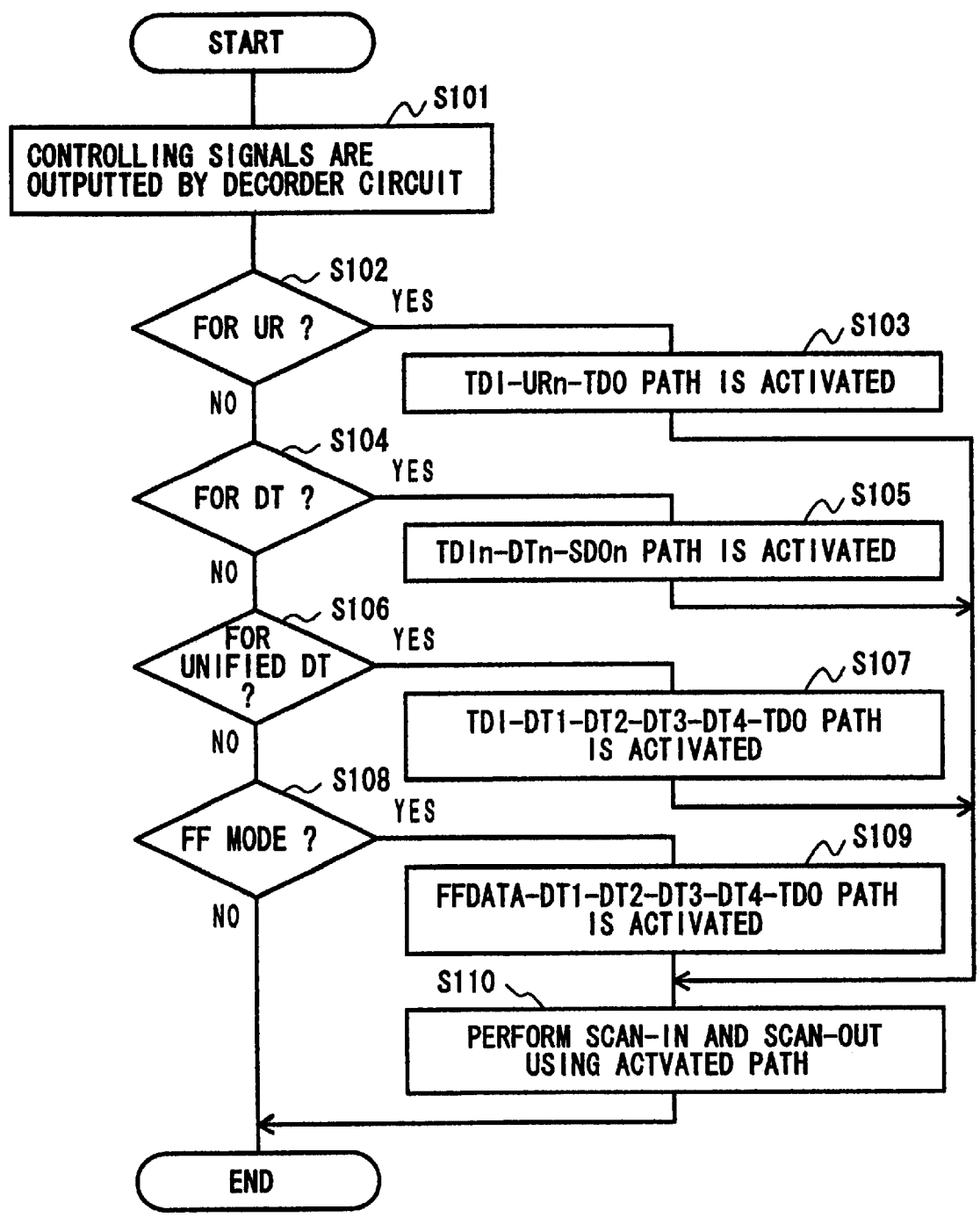
FIG. 12 is a flowchart showing the operation of the logic circuit in FIG. 11.

Here, referring FIG. 12, the functions of the switch circuits in FIG. 11 will be explained.

When a instruction code is supplied from the designer, the decoder circuit outputs the controlling signals corresponding to the instruction code to scan flipflops (step S101).

If the instruction code for the user register "URn" is supplied (step S102;YES), the decoder circuit controls the switch circuit $35_n$ so as to output the data from the data input terminal "TDI" and the switch circuit 38 to output the data from the final scan flipflop in the user register $33_n$. Thus, "TDI"-"URn"-"TDO" path is activated (step S103).

If the instruction code for the data chain "DTn" is supplied (step S104;YES), the decoder circuit controls the switch circuit $36_n$ to output the data from the data input terminal "SDIn". The decoder unit also controls the switch circuit 35 concerning the user register included in the data chain "DTn" so as to output the data from the terminal to which the data input terminal "SDIn" is not connected. Moreover, the decoder circuit controls the switch circuit 38 to output the data from the final flipflop of data chain "DTn". As a result of the control, "SDIn"-"DTn"-"SDOn" path is activated (step S105).

If the instruction code for the unified data chain is supplied (step S106;Y), the decoder circuit controls the switch circuits 37 to output the data from the data input terminal "TDI", and the switch circuit 36$_1$ to output the data from the switch circuit 37. Moreover, it controls the switch circuit 24$_n$ (n=2,3,4) to output the data from the final flipflop of data chain "DTm" (m=n−1). Further, it controls each switch circuit 35 so that the corresponding user register functions as a part of a data chain. The switch circuit 40 in data chain "DT3" is controlled to output the data from the RAM 32. And, the switch circuit 38 is controlled to output the data from the final flipflop in the data chain "DT4". As a result, "TDI"-"DT1"-"DT2"-"DT3"-"DT4"-"TDO" path is activated (step S107).

If the instruction code for a Full-Function-mode is supplied (step S108;Y), the decoder circuit controls the switch circuits 37 to output the data from the data input terminal "FF-DATA", and the switch circuit 361 to output the data from the switch circuit 37. Moreover, it controls the switch circuit 24$_n$ (n=2,3,4) to output the data from the final flipflop of data chain "DTm" (m=n−1). Further, it controls each switch circuit 35 so that the corresponding user resister functions as a part of a data chain. The switch circuit 40 in data chain "DT3" is controlled to output the data from the switch circuit 35$_3$. And, the switch circuit 38 is controlled to output the data from the final flipflop in the data chain "DT4". Thus, "FF-DATA"-"DT1"-"DT2"-"DT3" "DT4"-"TDO" path is activated (step S109).

After activating the desired path, the designer tests the logical circuit by performing Scan In and Scan Out (step S110).

Note that, the "TDI"-"URn"-"TDO" path (the user resister) is used for testing the system, and the "SDIn"-"DTn"-"SDOn" path is used for testing the LSI. And, the "TDI"-"DT1"-"DT2"-"DT3"-"DT4"-"TDO" path is used for testing the printed board and the "FF-DATA"-"DT1"-"DT2"-"DT3"-"DT4"-"TDO" path is used in BURN IN test.

<Logic Circuit Diagram Creating Process>

Hereafter, referring FIGS. 13 through 15, the logic circuit diagram creating process will be explained. In the logic circuit diagram creating process, a logical circuit diagram representing the logic circuit designed in the logic circuit design process is created.

In the logic circuit diagram creating process, the logic circuit design unit 14 creates a logic circuit diagram in which interconnections for the same purpose are represented with a bundle line. Moreover, the unit creates a logic circuit diagram in which an interface terminal is represented at a point where a interconnection or a bundle line crosses a boundary of a logic block. Therefore, the logic circuit design diagram as shown in FIG. 13 is created in the logic circuit diagram creating process.

Hereinafter, referring FIG. 13, the detailed operating procedures of the logic circuit design unit 14 in the logic circuit diagram creating process.

Figure 13:
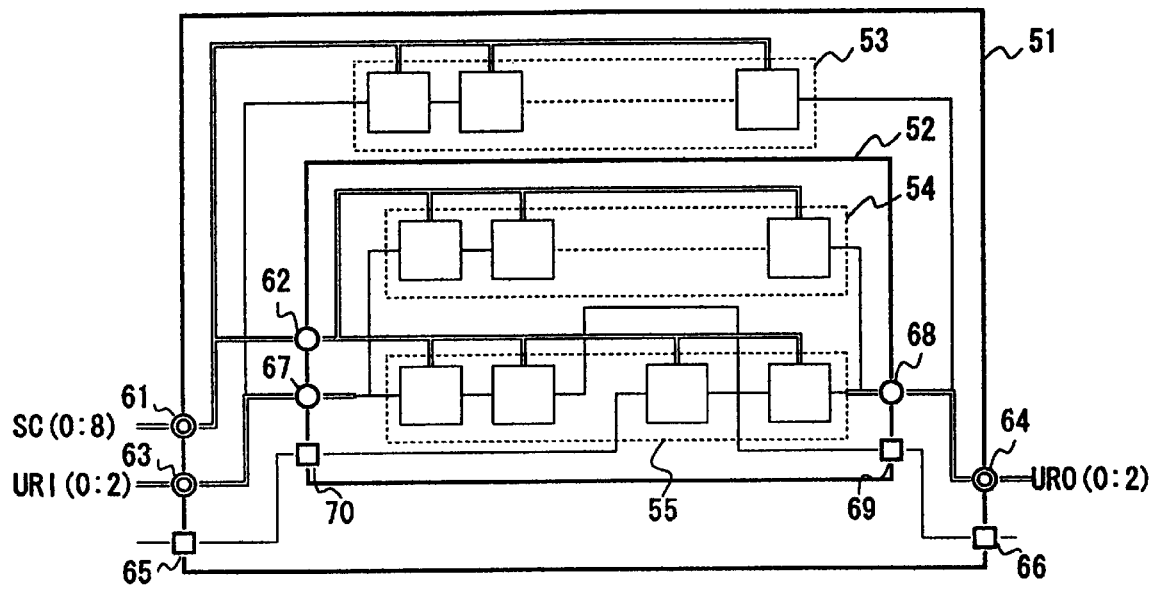
FIG. 13 is a logic circuit diagram created by the logic circuit design apparatus.

On the logic circuit in FIG. 13, three user registers 53–55 are generated. The user register 54 is constructed from flipflops in the logic block 52 which is included in the logic block 51, and the user register 55 is constructed from the flipflops inside of the logic block 52 and flipflops outside of the logic block 51.

Accordingly, the logic circuit needs, for controlling the user registers 53–55, nine interconnections which cross the boundary of the logic block 51 and six interconnections which cross the boundary of the logic block 52. Therefore, the logic circuit design unit 14 uses a bundle line for representing their nine interconnections, and generates the interface terminal 61 on the boundary of the logic block 51 for the bundle line. Moreover, the unit uses a bundle line for representing their three interconnections and generates the interface terminal 62 on the boundary of the logic block 52 for the bundle line.

Note that, when generating a interface terminal, the logic circuit design unit 14 uses a symbol corresponding to the number of interconnections. Therefore, in FIG. 13, the interface terminal 61 for nine interconnections is represented with the symbol "○", and the interface terminal 61 for six interconnections is represented with the symbol "○".

Further, the logic circuit needs eight interconnections for data I/O. The eight interconnections for data I/O include three interconnections used to input data to the user registers, three interconnections used to output data to the user registers, one interconnection used to output data to a flipflop outside of the logic block 51, and one interconnection used to input data from a flipflop outside of the logic block 51.

Therefore, the logic circuit design unit 14 generates the interface terminal 63 for the three interconnections used to input data to the user registers and the interface terminal 64 for the three interconnections used to output data from the user registers. Moreover, the unit generates the interface terminal 65 for the interconnection used to input data to the user registers and the interface terminal 66 for the interconnection used to output data to the flipflop outside of the logic block 51.

The logical circuit design unit 14 treats the interconnections which cross the boundary of the logic block 52 in the same way, generating the interface terminals 67–70 on the boundary.

Figure 14:
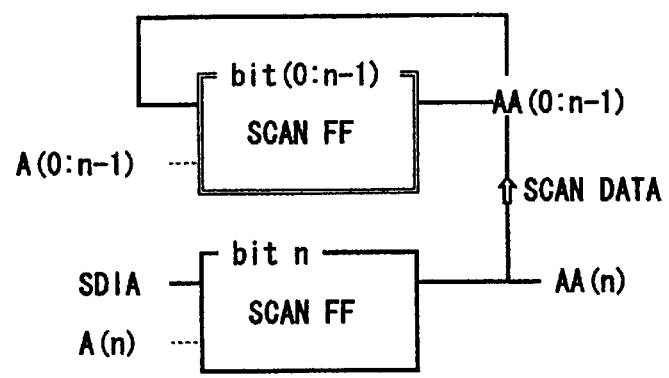
FIG. 14 is a logic circuit diagram created by the logic circuit design apparatus.
Figure 15:
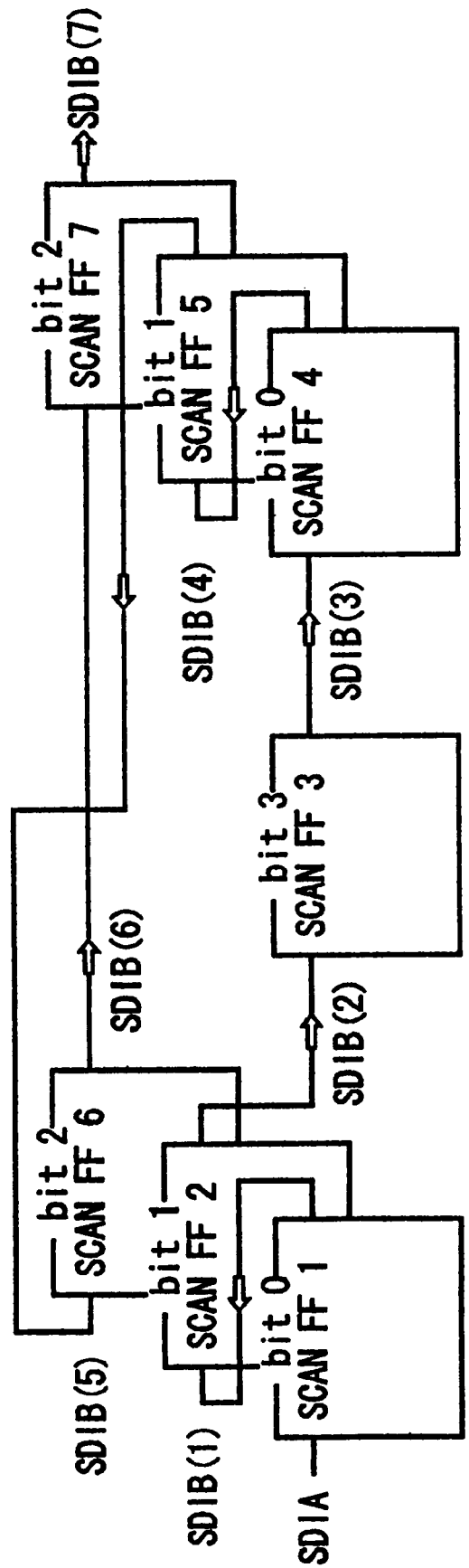
FIG. 15 is a logic circuit diagram created by the logic circuit design apparatus.

Moreover, if the scan circuit is generated from the flipflops containing a set of flipflops to be expressed in the stack notation, the logic circuit design unit 14 creates, as schematically shown in FIG. 14, the logic circuit diagram in which the set of scan flipflops are represented with two blocks one of which stands for the scan flipflop positioned at one end in the set of scan flipflops, and the other of which stands for the remaining scan flipflops in the set of the scan flipflops.

Moreover, if the scan circuit is generated from the flipflops containing a set of flipflops to be expressed in the stack notation under the condition of the interconnection length to shorten, the logic circuit design unit 14 creates a logic circuit diagram in which each interconnection is labeled with a signal name consists of a unique data to the user register and a complementary data relating to its position. That is, the unit labels, as schematically shown in FIG. 15, the same kind of signal name (SDIB(1)–SDIB(7)) to each interconnection.

As explained above, the logic circuit design unit 14 creates the logic circuit diagram easy to recognize.

<Logic Circuit Modifying Process and Logic Simulation Process>

The logic simulation process is used for testing the designed logical circuit, and the logic modifying process is used for modifying the designed logic circuit. These processes are executed if necessary.

Figure 16:
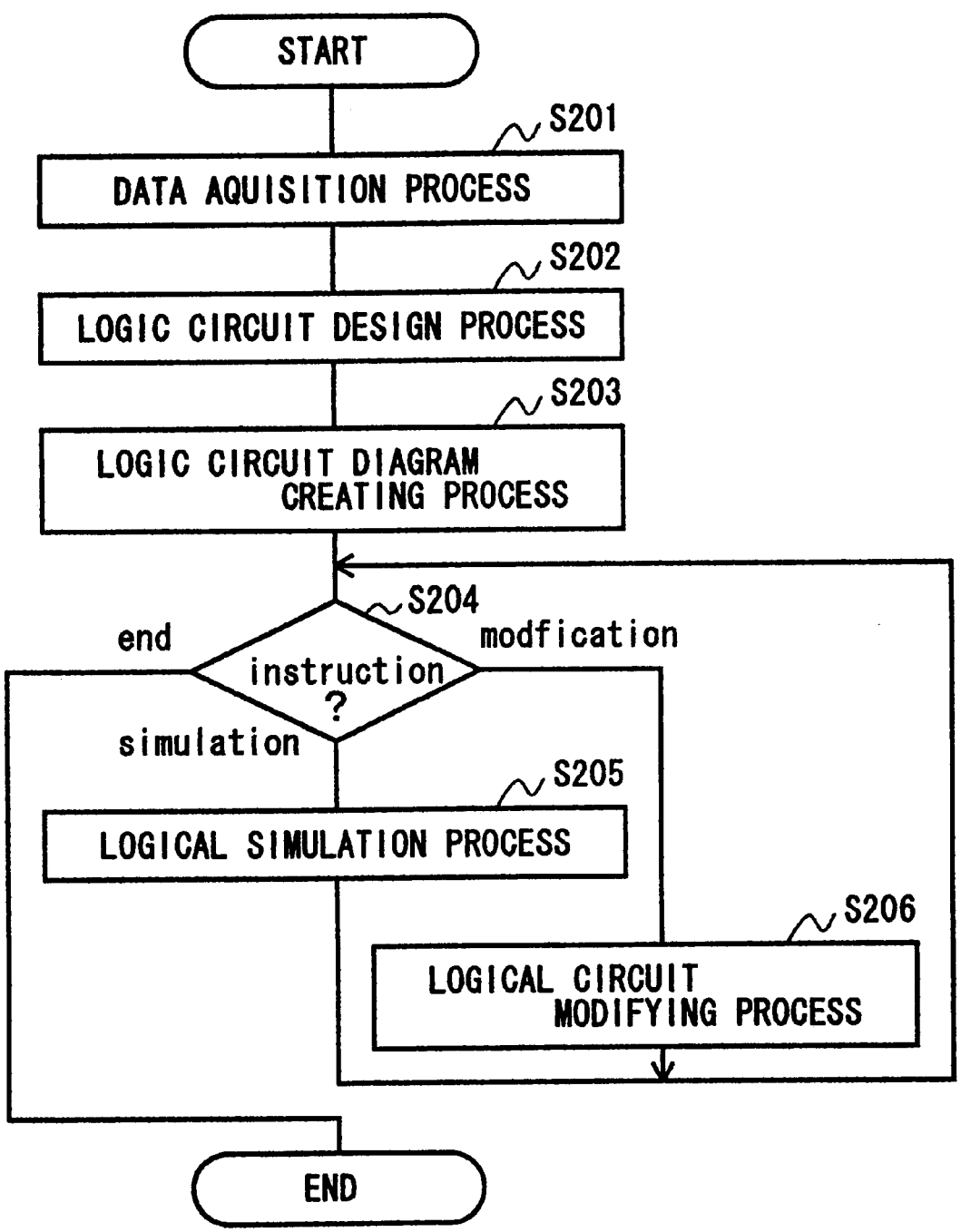
FIG. 16 is a flowchart showing an overall operating procedures of the logic circuit design apparatus.

That is, in the logic circuit design apparatus, as shown in FIG. 16, the data acquisition process is started (step S201) at first. Next, the logic design process (step S202) and the logic circuit diagram creating process (step S203) are executed, and the design of scan circuits is completed.

After the step S203, the logic circuit design unit 14 shifts to a state of waiting for an instruction data which specify the process to start (step S204). When an instruction data is inputted, the unit 14 starts the logic circuit modifying process (step S205) or the logic simulation process (S206) according to the inputted instruction data.

Generally, the designer repeats the logical simulation process and the logic circuit correction process until the desired simulation result is obtained, completing the design.

As this invention may be embodied in several forms without departing from the spirit of essential characteristics thereof, the present embodiment is therefore illustrative and not restrictive, since the scope of the invention is defined by the appended claims rather than by the description pending them, and all changes that fall within meets and bounds are therefore intended by the claims.

What is claimed is:

1. A logic circuit design apparatus, comprising:

a logic circuit design part to generate a plurality of shift registers and a plurality of switches on a logic circuit based on design data, each of the switches switching data to be inputted to one of the plurality of shift registers;

a user register design part to design a user register using flip flops;

a data chain design part to design a plurality of data chains using said user register; and a decoder circuit design part to generate a decoder circuit based on states of the designed logic circuit and the designed data chains, said decoder circuit selectively switching data from a designated data chain within the plurality of data chains by controlling the switches in the designed logic circuit, wherein a plurality of logical tests are selectively executed based upon the selection of said decoder circuit using the same data.

2. A logic circuit design apparatus according to claim 1, wherein the design data contains an attribute allocation data which allocates an attribute name to a memory element in the logic circuit and a user register specification data containing at least one attribute name, and said user register design part designs a user register from the memory elements to which the attribute name, which is contained in said user register specification data, is allocated by said attribute allocation data.

3. A logic circuit design apparatus according to claim 2, wherein said attribute allocation data is a data which associates a logic block and an attribute name, and said user register design part recognizes, if an attribute allocation data concerns a logical block containing a plural of memory elements is in the design data, that the attribute name in the attribute allocation data is allocated to all the memory elements in the logic block.

4. A logic circuit design apparatus according to claim 3, said user register design part recognizes, if the 1st attribute specification statement concerning the logic block X and the 2nd attribute allocation data concerning the logic block Y which includes the logic block Y exist in the design data file, that the attribute name described in the 1st attribute allocation data is allocated to the flipflops in the logic block X.

5. A logic circuit design apparatus according to claim 2, wherein said attribute allocation data contains a connection order data, and said user register design part designs the user register by stringing the memory elements in the order corresponding the connection order data.

6. A logic circuit design apparatus according to claim 2, wherein said attribute allocation data contains an opposite polarity use instruction data for instructing whether or not an opposite polarity terminal should be used, and said user-register design part designs the user-register by adding an inverter circuit to an opposite polarity output terminal of a memory element with an opposite polarity use instruction data implying that the opposite polarity terminal should be used and connecting the output of the inverter circuit with the following memory element.

7. A logic circuit design apparatus according to claim 4, wherein said data chain design part designs plural data chains composed of the memory elements of almost the same number and another data chain by stringing the data chains.

8. A logic circuit design apparatus according to claim 7, further comprising:

logic circuit diagram creating part for creating a logic circuit diagram of the logic circuit designed by said user register design means and said data chain design means.

9. A logic circuit design apparatus according to claim 8, wherein said logic circuit diagram creating part creates, in case a interconnection crosses a boundary of a logic block, a logical circuit diagram having an interface terminal symbol for the interconnection on the boundary.

10. A logic circuit design apparatus according to claim 8, wherein said logic circuit diagram creating part creates, in case two or more interconnections crosses a boundary of a logic block, a logic circuit diagram in which the interconnections are represented by a bundle line.

11. A logic circuit design apparatus according to claim 8, wherein said logic circuit diagram creating part creates, in case a user register containing a set of memory elements to be expressed with a stack notation exists, a logical circuit diagram in which their memory elements are represented with two blocks one of which stands for one memory element positioned at one end in the set of the memory elements, and the other of which stands for the remaining memory elements in the set of the memory elements.

12. A logic circuit design apparatus according to claim 7, further comprising:

a logic simulation part for testing the logic circuit designed by said user register design part and said data chain design part.

13. A logic circuit design apparatus, comprising:

logic circuit design means for generating a plurality of shift registers and a plurality of switches on a logic circuit based on design data, each of the switches switching data to be inputted to one of the plurality of shift registers;

user register design means for designing a user register;

data chain design means for designing a plurality of data chains using the user register; and decoder means for generating a decoder circuit based on states of the designed logic circuit and the designed data chains, the decoder means selectively switching data from a designated data chain within the plurality of data chains by controlling the switches in said logic circuit design means, wherein a plurality of logical tests are selectively executed based upon the selection of said decoder means using the same data.

* * * * *